(12) United States Patent
O'Masta et al.

(10) Patent No.: US 11,862,653 B2
(45) Date of Patent: Jan. 2, 2024

(54) CURVED IMAGING SENSOR PACKAGE WITH ARCHITECTED SUBSTRATE

(71) Applicant: HRL LABORATORIES, LLC, Malibu, CA (US)

(72) Inventors: Mark O'Masta, Malibu, CA (US); Jacob Hundley, Thousand Oaks, CA (US); Eric Clough, Santa Monica, CA (US); Christopher Roper, Malibu, CA (US); Geoffrey McKnight, Los Angeles, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 560 days.

(21) Appl. No.: 17/111,108

(22) Filed: Dec. 3, 2020

(65) Prior Publication Data

US 2021/0313374 A1    Oct. 7, 2021

Related U.S. Application Data

(60) Provisional application No. 63/004,197, filed on Apr. 2, 2020.

(51) Int. Cl.
*H01L 27/146* (2006.01)
(52) U.S. Cl.
CPC .... *H01L 27/14632* (2013.01); *H01L 27/1462* (2013.01); *H01L 27/14687* (2013.01)

(58) Field of Classification Search
CPC ........... H01L 27/14632; H01L 27/1462; H01L 27/14687; H01L 27/14634; H01L 27/14649; H01L 27/1465; H01L 27/14618
See application file for complete search history.

(56) References Cited

U.S. PATENT DOCUMENTS

| | | | |
|---|---|---|---|
| 9,570,488 B2 | 2/2017 | McKnight et al. | |
| 9,870,927 B2 | 1/2018 | Keefe et al. | |
| 10,062,727 B2 | 8/2018 | McKnight et al. | |
| 2007/0170363 A1* | 7/2007 | Schimert | G01J 5/22 250/353 |
| 2009/0115875 A1* | 5/2009 | Choi | H04N 25/00 257/E31.127 |
| 2016/0086994 A1* | 3/2016 | Guenter | H01L 27/14625 257/466 |
| 2016/0293661 A1 | 10/2016 | Keefe et al. | |

OTHER PUBLICATIONS

International Search Report and Written Opinion issued in corresponding International Application No. PCT/US2020/063143, dated Mar. 21, 2021, 9 pages.

(Continued)

*Primary Examiner* — Selim U Ahmed
(74) *Attorney, Agent, or Firm* — Lewis Roca Rothberger Christie LLP

(57) ABSTRACT

An imaging sensor package includes: an imaging sensor; and an architected substrate coupled to a bottom surface of the imaging sensor. The architected substrate has local stiffness variations along an in-plane direction of the architected substrate, and the imaging sensor and the architected substrate are curved.

20 Claims, 7 Drawing Sheets
(4 of 7 Drawing Sheet(s) Filed in Color)

(56) References Cited

OTHER PUBLICATIONS

Chambion, B., "Tunable curvature of large visible CMOS image sensors: Towards new optical functions and system miniaturization," 2016 IEEE 66th Electronic Components and Technology Conference, Electronic ISBN: 978-1-5090-1204-6, pp. 178-187.

Gaschet, C., "Curved sensors for compact high resolution wide field designs," Proceedings of SPIE, HRL with Microsoft, 2017, 12 pages.

Gaschet, C., "Methodology to design optical systems with curved sensors," Applied Optics, vol. 58, No. 4, Feb. 1, 2019, pp. 973-978, https://doi.org/10. 1364/AO.58.000973.

Gregory. J., "Development and application of spherically curved charge-coupled device imagers," Applied Optics, vol. 54, No. 10, Apr. 1, 2015, pp. 3072-3082, https://doi.org/10.1364/AO.54.003072.

Guenter, B., "Highly curved image sensors: a practical approach for improved optical performance," Optics Express. vol. 25, No. 12, Jun. 12, 2017, 13010-13023, doi:10.1364/OE.25.013010.

Lee, G.J., "Bioinspired Artificial Eyes: Optic Components, Digital Cameras, and Visual Prostheses," Advanced Science News, Advanced Functional Materials, 2018, 17 pages, DOI: 10.1002/adfm.201705202.

Lombardo, "Curved sensors developments and characterization: application to astronomical instruments," Proceedings of SPIE, 2018, 10 pages, doi: 10.1117/12.2312654.

Lee, G. J., et al., "Bioinspired Artificial Eyes: Optic Components, Digital Cameras, and Visual Prostheses," Advanced Functional Materials, 2018, 17 pages, DOI: 10.1002/adfm.201705202.

Gregory, J.A., "Development and application of spherically curved charge-coupled device imagers," Applied Optics, vol. 54, No. 10, Apr. 1, 2015, 11 pages, https://doi.org/10.1364/AO.54.003072.

Chambion, B., "Tunable curvature of large visible CMOS image sensors: Towards new optical functions and system miniaturization," 2016 IEEE 66TH Electronic Components and Technology Conference, 10 pages, Electronic ISBN: 978-1-5090-1204-6.

Gaschet, C., "Methodology to design optical systems with curved sensors," Applied Optics, vol. 58, No. 4, Feb. 1, 2019, 6 pages, https://doi.org/10.1364/AO.58.000973.

Lombardo, S., et al., "Curved sensors developments and characterization: application to astronomical instruments," Proceedings of SPIE, 2018, 10 pages, doi: 10.1117/12.2312654.

Gaschet, C., et al., "Curved sensors for compact high resolution wide field designs," Proceedings of SPIE, 2017, 12 pages, doi: 10.1117/12.2272451.

Guenter, B., et al., "Highly curved image sensors: a practical approach for improved optical performance," Opt. Express 13010, vol. 25, No. 12, Jun. 12, 2017, pp. 13010-13023. doi:10.1364/OE.25.013010.

* cited by examiner

CURVED IMAGING SENSOR PACKAGE WITH ARCHITECTED SUBSTRATE

CROSS-REFERENCE TO RELATED APPLICATION

The present application claims priority to and the benefit of U.S. Provisional Patent Application Ser. No. 63/004,197, filed on Apr. 2, 2020, in the United States Patent and Trademark Office, the entire content of which is incorporated herein by reference.

FIELD

One or more aspects of embodiments of the present disclosure relate to a curved imaging sensor package with an architected substrate.

BACKGROUND

Recently, the demand for imaging sensors (e.g., optical imaging sensors), such as complementary metal-oxide-semiconductor (CMOS) and charge-coupled device (CCD) sensors for optical imaging systems (e.g., optical cameras), infrared imaging systems (e.g., infrared cameras), light detection and ranging (LIDAR) systems, infrared search and track (IRST) systems, imaging satellites, etc., has rapidly increased.

Related art imaging sensors are flat (also referred to as flat focal plane arrays (FPA)) for ease of manufacture. To project the incident light (e.g., visible light, infrared radiation, etc.) onto a flat focal plane, flat imaging sensors generally include lenses and/or other optical devices so that flat imaging sensor accurately captures and interprets the incident light. Curved imaging sensors, on the other hand, do not require the same complex optics as the need to correct for spherical aberration encountered when projecting incident light onto a flat focal plane (e.g., the need to create a flat focal plane) is reduced or eliminated. As such, curved imaging sensors allow for a wider range of lens designs and may be able to acquire sharper, more detailed images and operate with lower light levels, thereby extending the operational window (e.g., the operational parameters) for the imaging device when compared to related art flat imaging sensors. Also, due to the reduced optics complexity for curved imaging sensors, the size (e.g., the volume and weight) of the imaging system may be reduced when compared to flat imaging sensors, thereby enabling new applications. Furthermore, a curved imaging sensor, which has a curved focal plane, may maintain uniform or substantially uniform illumination across the entire field of view (FOV) for wide FOV imagers, and the optical simplicity reduces transmission losses, thereby increasing the possible frame rate.

Curving a flat imaging sensor (e.g., a flat focal plane array (FPA)) to have a curved (e.g., spherical) surface is challenging, and curving an imaging sensor about two axes with a non-zero Gaussian curvature is increasingly challenging as the size of the imaging sensor increases and the radius of curvature (ROC) decreases due to increasing strain in the imaging sensor. Increasing strain in the imaging sensor may lead to breakage, and when the strain across an imaging sensor is highly non-linear, which is typical when spherically curving a flat imaging sensor, the output (e.g., the electronic response) of the imaging sensor may be considerably shifted, causing concomitant degradation in dark noise and operability.

SUMMARY

Aspects of embodiments of the present disclosure provide a curved imaging sensor package that may be larger and may be curved to have a tighter radius of curvature than related art curved imaging sensors without breakage and without suffering from degraded imaging performance by including an architected substrate under an imaging sensor. The architected substrate imparts a low-amplitude wrinkling phenomenon onto the imaging sensor that reduces deleterious strain while allowing the imaging sensor (e.g., the FPA) to remain near the spherical focal surface for accurate imaging. For example, the architected substrate may be coupled (e.g., bonded, adhered, deposited, or attached) to a bottom surface of an imaging sensor to form a sensor package, and as the sensor package (e.g., the sensor-architected substrate laminate) is curved, the architected substrate imparts the wrinkling phenomenon onto the imaging sensor. Overall, the imaging sensor will assume the curvature of the mold while exhibiting low-amplitude wrinkles (e.g., small deviations) in the surface thereof. These wrinkles in the imaging sensor form local changes in the bending stiffness (e.g., the flexural rigidity) of the imaging sensor, which adjusts and/or changes the stress distribution within the imaging sensor, thereby reducing or preventing stress or strain concentrations and magnitude. Thus, the architected substrate may adjust the stress distribution across the imaging sensor to mitigate failure and imaging degradation when it is curved. For example, the total strain energy in the imaging sensor may be reduced by alleviating the compressive strain therein through the low-amplitude wrinkling that occurs during the curving such that even large-format imaging sensors (e.g., imaging sensors having greater than 55 mm diagonal lengths) may be curved to relatively tight radii of curvature. In addition, because the low-amplitude wrinkling occurs on a sub-pixel scale (e.g., one light receiving element or pixel is larger than one wrinkle), there is no substantial degradation in imaging performance as may be expected from a "wrinkled" imaging sensor.

According to an embodiment, an imaging sensor package includes: an imaging sensor; and an architected substrate coupled to a bottom surface of the imaging sensor. The architected substrate has local stiffness variations along an in-plane direction of the architected substrate, and the imaging sensor and the architected substrate are curved.

The imaging sensor may include a detector arranged between a readout integrated circuit and an antireflective coating.

The imaging sensor and the architected substrate may be spherically curved.

The architected substrate may have thickness variations along the in-plane direction thereof.

The architected substrate may have a plurality of discontinuous portions.

The architected substrate may include a plurality of sandwich panels with a core between the sandwich panels.

The core may include a plurality of core members extending between the sandwich panels.

The core members may be arranged in a prismatic, lattice, or stochastic form.

An outermost one of the sandwich panels may have openings therein.

An innermost one of the sandwich panels may be continuous along the bottom surface of the imaging sensor.

According to an embodiment, a curved imaging sensor package includes: a curved imaging sensor including a detector and a readout integrated circuit below the detector, the detector including a plurality of light detecting elements spaced from each other; and a curved architected substrate coupled to a surface of the readout integrated circuit opposite to the detector. The architected substrate has local stiffness variations along an in-plane direction of the architected substrate.

The imaging sensor may be wrinkled, and a wavelength of the wrinkles may be less than a pitch of the light detecting elements.

The wavelength of the wrinkles may be less than a size of the light detecting elements.

An amplitude of the wrinkles may be less than twice the pitch of the light detecting elements.

The architected substrate may include a plurality of different materials.

The different materials may be stacked on each other in layers.

The different materials may be adjacent to each other in the in-plane direction.

The materials may be mixed together at a portion of the architected substrate.

The materials may include aluminum, copper, nickel, iron, invar, steel, titanium, molybdenum, tungsten, and/or bismuth.

The imaging sensor may have a diagonal length of at least 55 mm.

According to an embodiment, a method of manufacturing an imaging sensor package is provided. The method includes: forming an architected substrate to have local stiffness variations along an in-plane direction of the architected substrate; coupling the architected substrate to a bottom surface of an imaging sensor; and curving the imaging sensor with the architected substrate coupled thereto.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above-described and other aspects and features of the present disclosure will be further appreciated and better understood with reference to the specification, claims, and appended drawings, in which:

DETAILED DESCRIPTION

Figure 1:
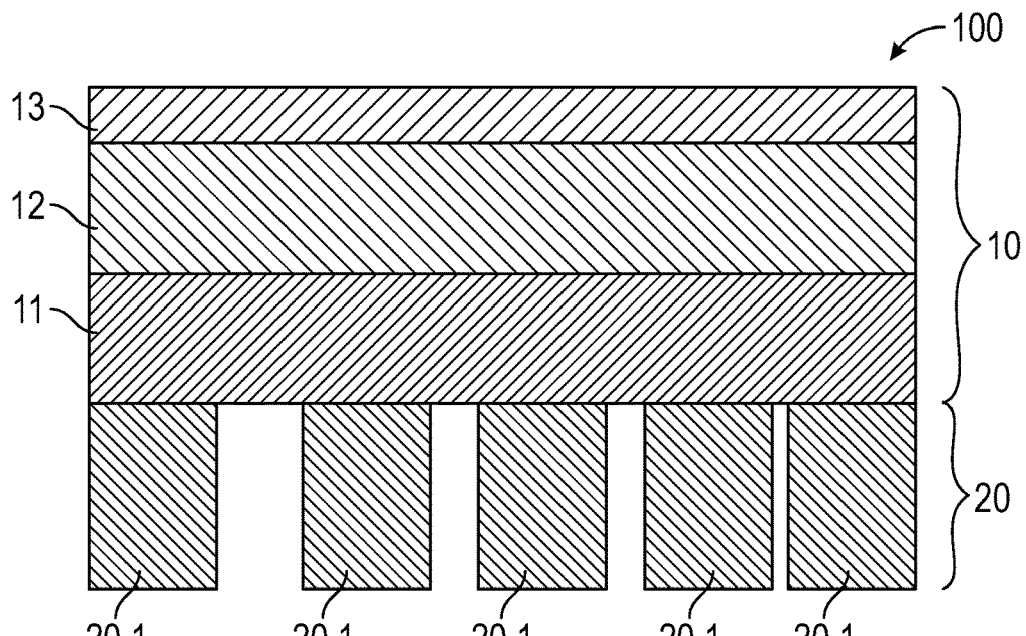
FIG. 1 is a cross-sectional view of an imaging sensor packing according to an embodiment of the present disclosure in a flat state.

The detailed description set forth below, in connection with the appended drawings, is intended as a description of example embodiments of the present disclosure and is not intended to represent the only forms in which the present disclosure may be embodied. The description sets forth aspects and features of the present disclosure in connection with the illustrated example embodiments. It is to be understood, however, that the same or equivalent aspects and features may be accomplished by different embodiments, and such other embodiments are encompassed within the spirit and scope of the present disclosure. As noted elsewhere herein, like reference numerals in the description and the drawings are intended to indicate like elements. Further, descriptions of features, configurations, and/or other aspects within each embodiment should typically be considered as available for other similar features, configurations, and/or aspects in other embodiments.

FIG. 1 shows a cross-sectional view of an imaging sensor package 100 according to an embodiment of the present disclosure. In FIG. 1, the imaging sensor package 100 is shown in a flat state for convenience of description. It is to be understood that the imaging sensor package 100 may be curved in one or more directions (e.g., along one or more axes). Depending on the needs and design of a particular imaging system, the imaging sensor package 100 may be curved to have a spherical, aspherical, cylindrical, parabolic, or any suitable non-planar surface or shape. In one embodiment, the imaging sensor package 100 may be curved to have a spherical curvature (e.g., may be curved along two in-plane axes) (see, e.g., FIGS. 5A and 5B).

Referring to FIG. 1, the imaging sensor package 100 includes an imaging sensor 10 coupled to an architected substrate (e.g., a patterned substrate) 20. Together, the imaging sensor 10 and architected substrate 20 may be referred to as the sensor-substrate laminate or simply as the imaging sensor package 100.

The imaging sensor 10 may include a readout integrated circuit 11, a detector 12 on the readout integrated circuit 11, and an antireflective coating 13 on the detector 12. The architected substrate 20 is arranged below (e.g., is coupled to a bottom surface of) the readout integrated circuit 11. In some embodiments, the imaging sensor 10 may be formed (e.g., separately formed) and then coupled to the architected substrate 20. But in other embodiments, a complete (e.g., unpatterned) substrate may be coupled to the imaging sensor 10 and then patterned to form the architected substrate 20.

The detector 12 may include a plurality of light sensing elements, and the readout integrated circuit 11 may act as a substrate for the light sensing elements. The imaging sensor 10 may be sensitive to (e.g., may receive and interpret) different wavelength ranges of light based on the composition of the detector 12. For example, the detector 12 may be sensitive to visible or infrared (IR) light, and the infrared light may be near infrared radiation (NIR), short-wave infrared radiation (SWIR), medium-wave infrared radiation (MWIR), and/or long-wave infrared radiation (LWIR).

Infrared sensing detectors (e.g., infrared sensing elements) may include a Type II strained layer superlattice (SLS) (e.g., InSb, InAs/InAsSb), a III-V bulk alloy, a photovoltaic material (e.g., mercury cadmium telluride, InSb, PbSnTe, PtSi), a photoconductive material (e.g., mercury cadmium telluride, InSb, InGaAs/InP, Ge, doped silicon), and/or a microbolometer (e.g., vanadium oxide or amorphous silicon). Visible light detectors (e.g., visible light sensing elements) may include a charge-coupled device (CCD) and/or a complementary-metal-oxide semiconductor (CMOS).

The light sensing elements of the detector 12 may be spaced from each other by a distance (e.g., may have a pitch)

in a range from about 1 μm to about 40 μm and may be coupled to (e.g., may be formed on) the readout integrated circuit 11. The readout integrated circuit 11 may include a substrate formed or (or including) silicon, germanium, and/or other suitable semiconductor materials and may further include oxide layers and metal lines to act as the readout integrated circuit 11.

Figure 4A:
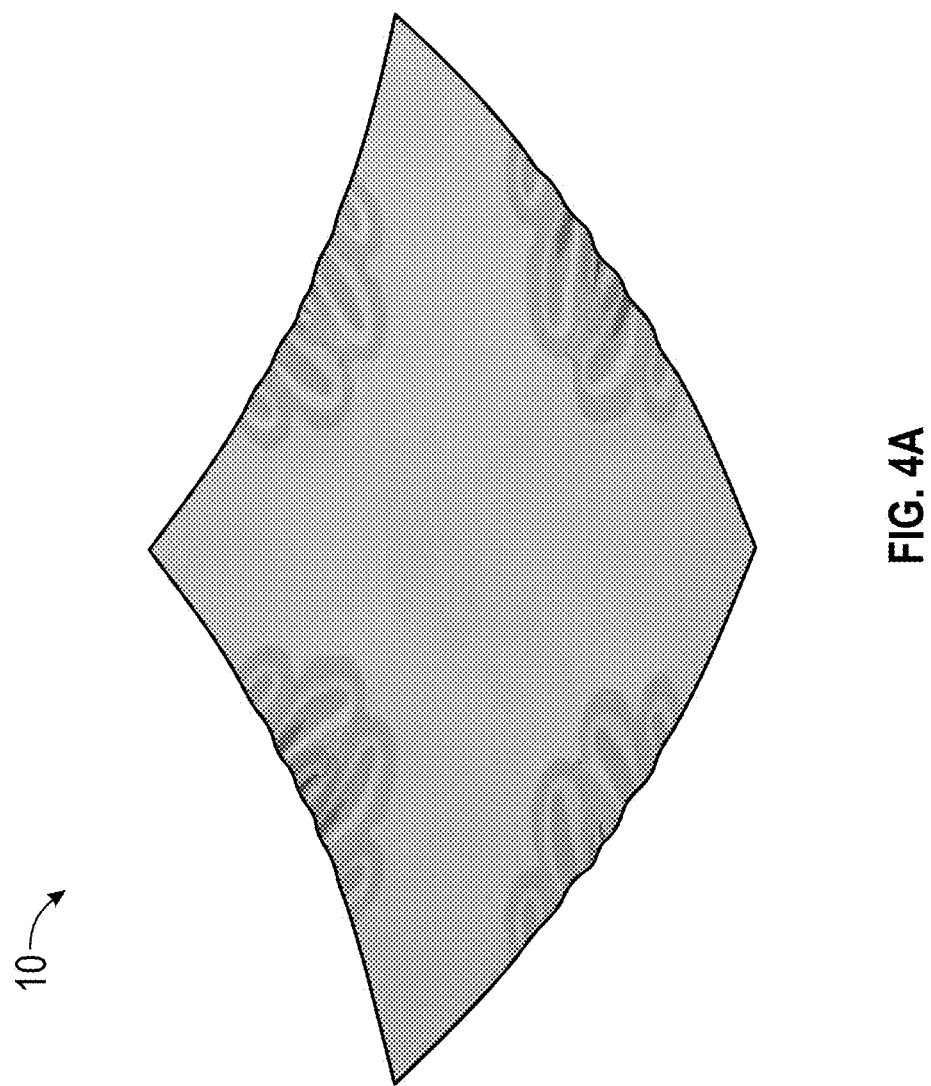
FIGS. 4A and 4B show finite element analyses of a curved imaging sensor without an architected substrate.
Figure 4B:
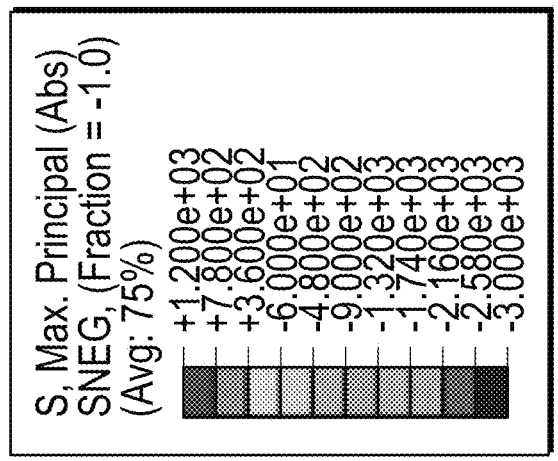
Figure 4B:
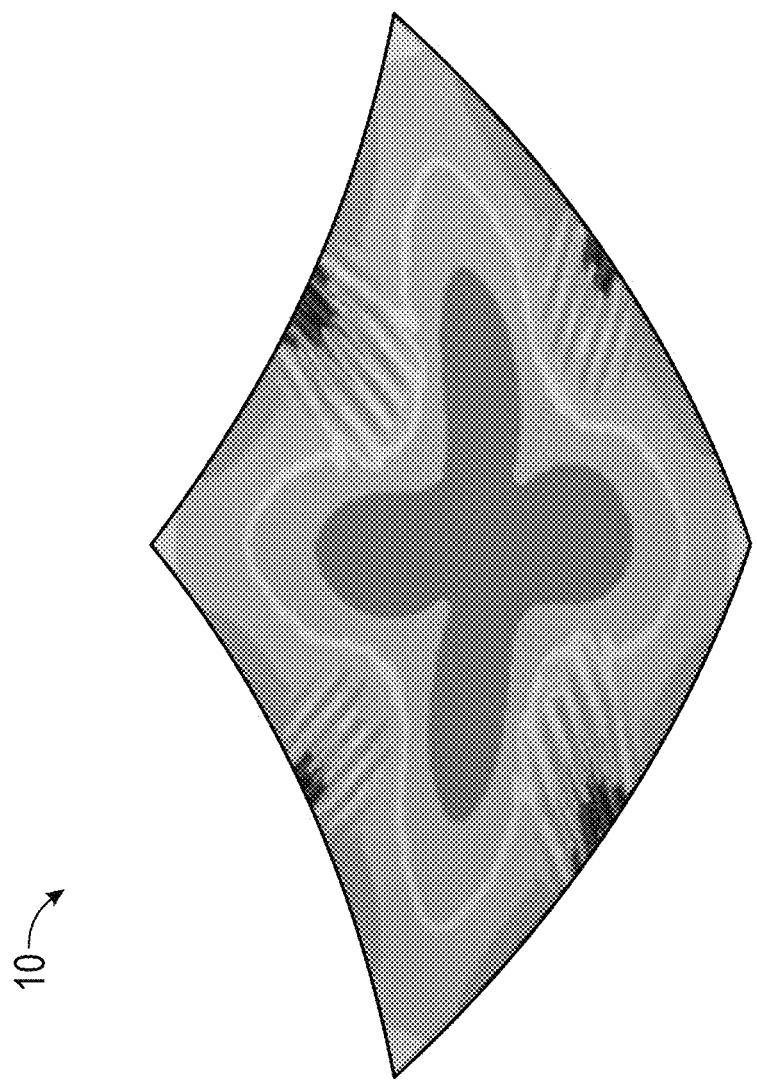

FIGS. 4A and 4B show finite element analyses of an imaging sensor 10 without the architected substrate 20 curved in two directions (e.g., spherically curved). FIG. 4A shows physical deformation of the imaging sensor 10, and FIG. 4B shows stress distribution in the imaging sensor 10.

As can be seen in FIG. 4A, when the imaging sensor 10 without the architected substrate 20 is curved, it undergoes uncontrolled wrinkling primarily concentrated at edge centers, and as can be seen in FIG. 4B, the imaging sensor 10 without the architected substrate 20 experiences relatively high local compressive and tensile stresses.

Figure 5A:
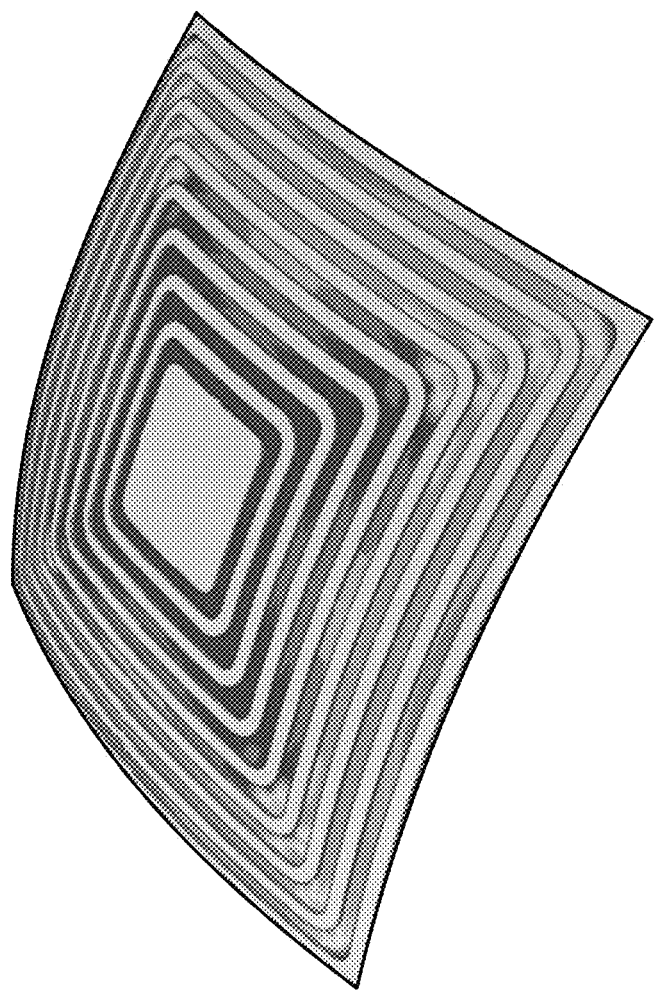
FIGS. 5A and 5B show finite element analyses of a curved imaging sensor package according to embodiments of the present disclosure.
Figure 5B:
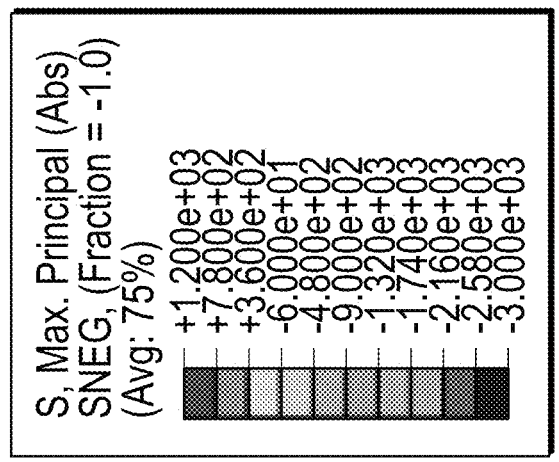
Figure 5B:
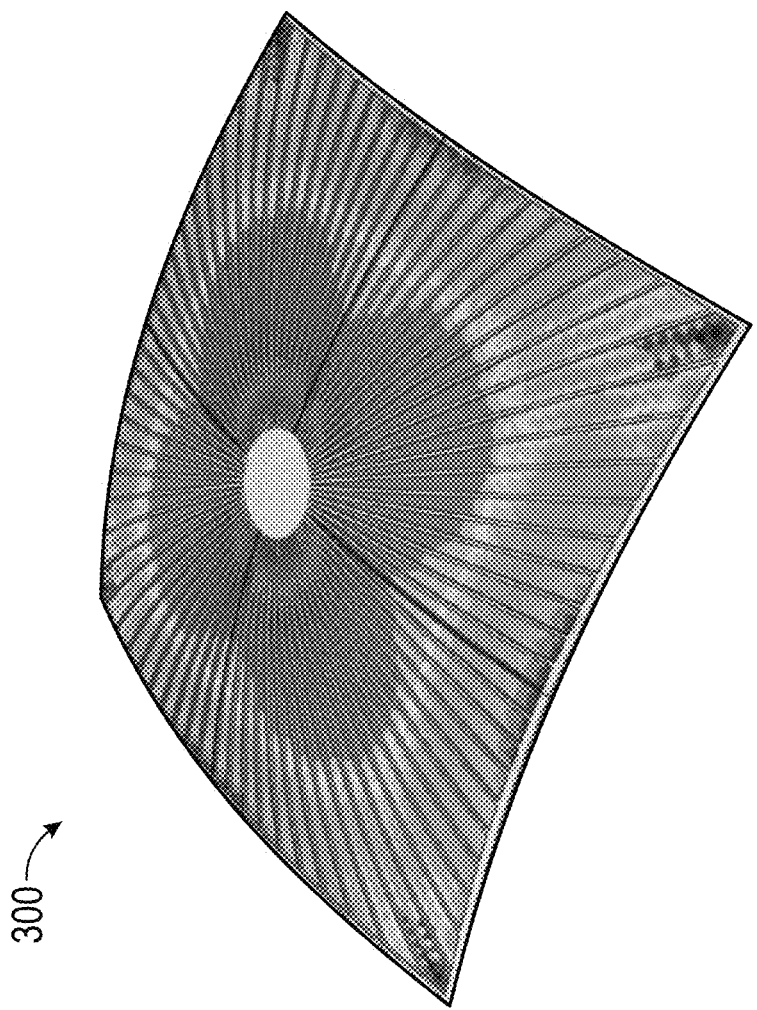

FIGS. 5A and 5B show finite element analyses of different embodiments of the imaging sensor package, which includes the imaging sensor 10 and different embodiments of the architected substrate 20, that is curved in two directions (e.g., that is spherically curved). FIGS. 5A and 5B correspond to FIG. 4B (e.g., show stress distributions) but include the architected substrates.

FIG. 5A shows the stress distributions in the image sensor package 200 that includes an island-type (e.g., square pattern) architected substrate 20, which is described below in more detail. FIG. 5B shows the stress distributions in the image sensor package 300 that includes a radially-patterned architected substrate 20, which is also described below in more detail.

As can be seen in FIGS. 5A and 5B, by coupling the architected substrate 20 to the bottom surface of the imaging sensor 10, the stress is less concentrated in the imaging sensor 10 (e.g., the stress is more evenly distributed across the imaging sensor 10), which also reduces uncontrolled wrinkling or buckling by inducing controlled, low-amplitude wrinkling in the imaging sensor 10, discussed further below. The low-amplitude wrinkling may be considered as local deviations from the ideal curved surface.

Figure 2:
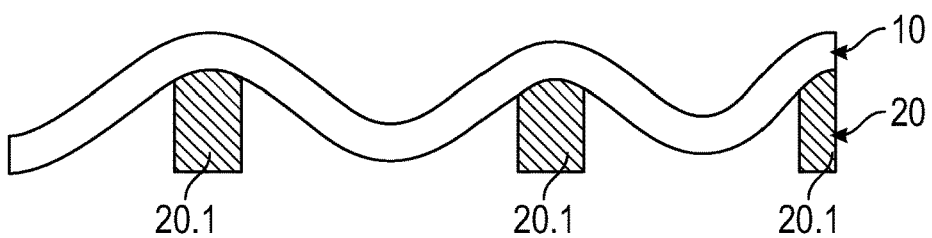
FIG. 2 is a schematic cross-sectional view of the imaging sensor package shown in FIG. 1 shown in a curved state.

That is, the imaging sensors 10 in the imaging sensor packages 200 and 300, shown in FIGS. 5A and 5B, respectively, experience low-amplitude wrinkling. FIG. 2 is a schematic cross-section illustration of the imaging sensor package 100 that shows the low-amplitude wrinkling of the imaging sensor 10 in an exaggerated manner for convenience of description.

Figure 6:
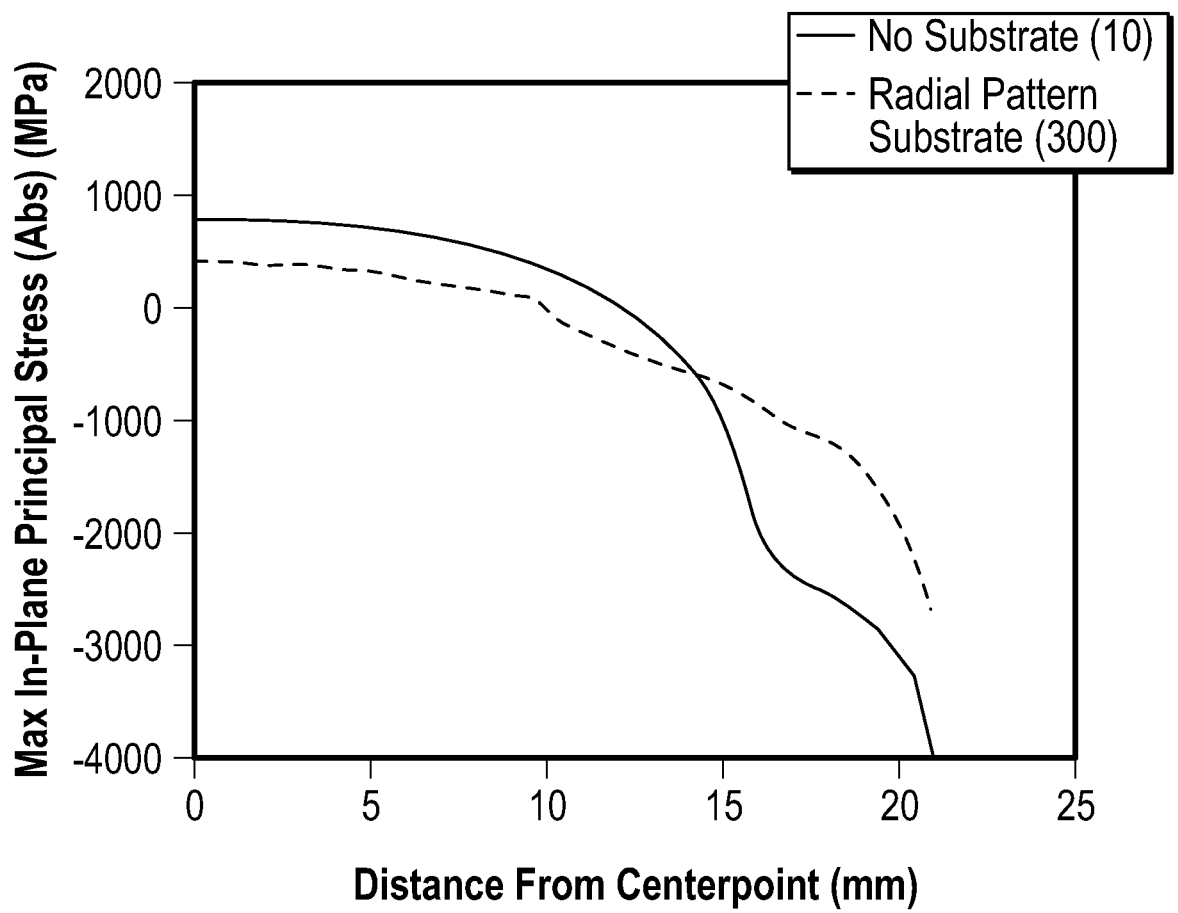
FIG. 6 is a graph showing maximum principal stress distribution across a curved imaging sensor without an architected substrate compared to a curved imaging sensor package including a radially-patterned architected substrate according to an embodiment of the present disclosure.

FIG. 6 is a graph showing differences in maximum in-plane stress of an imaging sensor as a function of distance from a center point thereof. The solid line refers to the imaging sensor 10 without an architected substrate (see, e.g., FIGS. 4A and 4B), and the dotted line refers to the curved sensor package 300 with the radially-patterned architected substrate (see, e.g., FIG. 5B). As can be seen, the in-plane stress is much more evenly distributed throughout the imaging sensor package 300 that includes the architected substrate than in the imaging sensor 10 without the architected substrate.

Hereinafter, aspects of embodiments of the architected substrate 20 will be described in more detail. The architected substrate 20 reduces the total strain energy in the imaging sensor 10 by alleviating compressive strain through the low-amplitude wrinkling as schematically shown in FIG. 2.

The architected substrate 20 may be designed such that the low-amplitude wrinkling of the imaging sensor 10 does not affect or substantially affect the imaging quality of the imaging sensor 10. For example, the architected substrate 20 may be designed such that the wavelength of the wrinkling (e.g., the distance between wrinkling peaks) is smaller than the size of one light detecting element (e.g., one pixel); thus, many or all pixels in the imaging sensor 10 are subject to at least one and possibly more than one wrinkle, resulting in substantially consistent impact on light collection efficiency of the light detecting elements and little overall effect on image output. On the other hand, uncontrolled wrinkling, such as may be experience by curved imaging sensors without the architected substrate 20 (see, e.g., FIGS. 4A and 4B) affects pixels differently (e.g., some pixels may be subjected to greater wrinkling than other pixels), causing some pixels to suffer highly degraded light collection efficiency and variant focal lengths compared to other pixels in the same imaging sensor, resulting is a distorted output image. Further, the amplitude of the low-amplitude wrinkling may also be smaller than the pixel size while the wavelength expands beyond the size of the pixel, which improves consistency and output image quality over uncontrolled wrinkling. For example, the amplitude may be less than twice the width of one pixel or may be less than one-quarter the width of one pixel. In some embodiments, the average deviation of the pixel normal from ideal is less than about 45 degrees and may be less than about 10 degrees.

The architected substrate 20 has non-uniform patterning, such as non-uniform thickness and/or material composition, which create stiffness variations or discontinuities in the architected substrate 20. These stiffness discontinuities (e.g., areas of relatively high and relatively low stiffness) impart the low-amplitude wrinkling to the imaging sensor 10 as it is curved (e.g., as it is curved in a mold). The architected substrate 20 retains (or substantially retains) its volume throughout the curving process.

The architected substrate 20 may have a size that is longer in two directions (referred to as in-plane directions) than in a third direction (referred to as an out-of-plane direction). In some embodiments, the in-plane directions may be a length direction and a width direction of the architected substrate 20, and the out-of-plane direction may be a thickness direction of the architected substrate 20.

The architected substrate 20 may be larger (e.g., may have a larger surface area or volume) or smaller than the imaging sensor 10. For example, the in-plane size (e.g., the surface area) of the architected substrate 20 may be in a range from about 40% to about 200% of the in-plane size (e.g., the surface area) of the imaging sensor 10. In one embodiment, the in-plane size of the architected substrate 20 and the imaging sensor 10 may be the same or substantially the same.

The architected substrate 20 may have an outer profile having a square, rectangular, circular, elliptical, or arbitrary shape. In one embodiment, the outer profile (e.g., the outer peripheral shape) of the architected substrate 20 and the imaging sensor 10 may be the same or substantially the same.

The architected substrate 20 may have a thickness (e.g., an out-of-plane substrate thickness) in a range between about 1 μm and about 400 μm. In some embodiments, the architected substrate 20 may have a thickness in a range from about 0.5 μm to about 5 μm or between about 15 μm and about 100 μm. When viewed from the perspective of the ratio of the length of the imaging sensor 10 to the greatest thickness of the imaging sensor package 100, the ratio will be between about 20 and about 500. In some embodiments, the ratio will be between about 20 and about 50 to provides regions with larger wrinkling resistance. In other embodiments the ratio may be between about 200 to about 400 to lower the stored elastic energy in the imaging sensor package 100. The thickness of the architected substrate depends upon effective mechanical properties of the substrate and imaging sensor 10, thickness of the imaging sensor 10, pixel size, and the radii of curvature to which the imaging sensor package 100 is curved.

The thickness of the architected substrate 20 may vary along the length and/or width directions (e.g., may vary along the in-plane position) thereof to create the stiffness discontinuities therein. In some embodiments, the architected substrate 20 may be non-continuous (e.g., the thickness may be zero in some areas). In some embodiments, such discontinuities may be provided such that an island-type architected substrate 20 including a plurality of separate pieces is provided, and the separate pieces may be individually coupled to the imaging sensor 10 and not directly coupled to each other. For example, the architected substrate 20 shown in FIGS. 1 and 2 may be an island-type architected substrate 20 including a plurality of separate pieces 20.1 Similarly, the architected substrate shown in FIG. 5A is also an island-type architected substrate. As another embodiment, the architected substrate shown in FIG. 5B has discontinuities (e.g., areas of zero thickness) is a single component as all of the radial fingers of the architected substrate meet at the center thereof. For ease of description, the island-type architected substrate 20 may be considered as a single component with 0 thickness in some areas. That is, the thickness of the architected substrate 20 may vary between full thickness (100%) and no material present, or discontinuous, (0%) along in-plane positions thereon. At areas other than any discontinuous area, the thickness may not be less than 5% the full thickness to reduce risk of breakage or the like. Further, the thickness of the architected substrate 20 may vary continuously (e.g., the thickness transitions may be smooth or relatedly smooth) or discretely (e.g., step differences may be present between different thickness portions).

By varying the thickness of the architected substrate 20 along the in-plane position, the imaging sensor 10 is allowed to deviate from an ideal surface when it is curved (e.g., the imaging sensor 10 may wrinkle or buckle) in a controlled manner to mitigate any stress concentrations in the imaging sensor 10 during curving (or bending), thereby allowing tighter radii of curvature with lower risk of breakage and little, if any, degradation of the imaging performance. As can be seen in FIG. 2, for example, the imaging sensor 10 wrinkles at the lower stiffness portions (e.g., the discontinuous portions) of the architected substrate 20. In this manner, the wrinkling of the imaging sensor 10 may be controlled by designing the thickness variations in the architected substrate 20.

In some embodiments, the architected substrate 20 may have local variations in density in the out-of-plane direction (e.g., in the thickness direction). For example, in some embodiments, the architected substrate may include (or may be formed of) sandwich panels with a core (e.g., a prismatic, lattice, or stochastic core) between the sandwich panels.

Figure 3A:
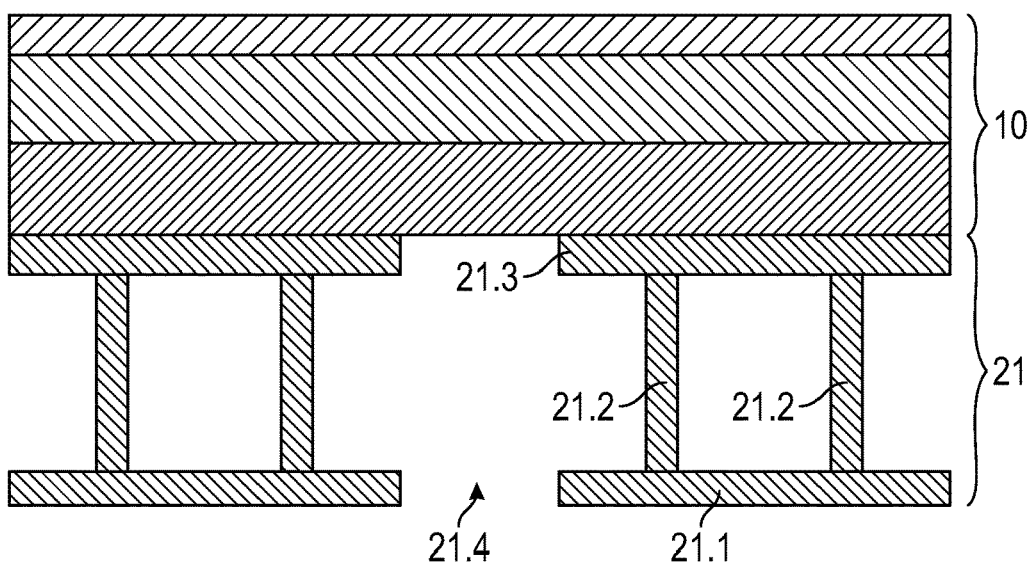
FIGS. 3A-3C show different embodiments of an architected substrate of the imaging sensor package shown in FIG. 1.

Referring to FIG. 3A, the architected substrate 21 includes sandwich panels 21.1, 21.3 with core members 21.2 extending between the sandwich panels 21.1, 21.3 with an opening 21.4 in the architected substrate 21 to form a prismatic architected substrate 21. While only one opening 21.4 in the architected substrate 21 is shown, the present disclosure is not limited thereto, and the architected substrate 21 may include additional openings therein.

The architected substrate 21 has a discontinuous area (e.g., the opening 21.4), which provides a local reduction in stiffness of the architected substrate 21, but in other embodiments, the core members 21.2 may be various arranged to vary the stiffness of the architected substrate 21 along the in-plane position. For example, the core members 21.2 may be spaced farther apart from each other in some areas of the architected substrate 21 than in other areas thereof to create the stiffness discontinuities. In other embodiments, the outermost sandwich panel 21.1 and the core members 21.2 may be removed in one area, leaving only the innermost sandwich panel 21.3, thereby also creating a local area of reduced stiffness.

Figure 3B:
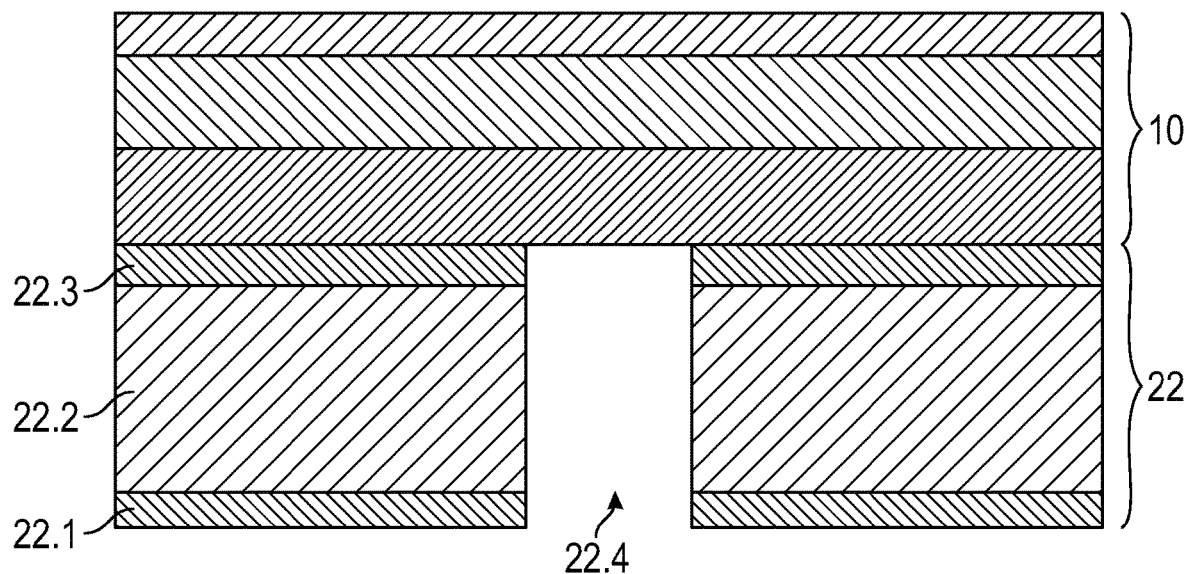

Referring to FIG. 3B, the architected substrate 22 includes a stochastic core 22.2 between sandwich panels 22.1, 22.3, with an opening 22.4 therein.

Figure 3C:
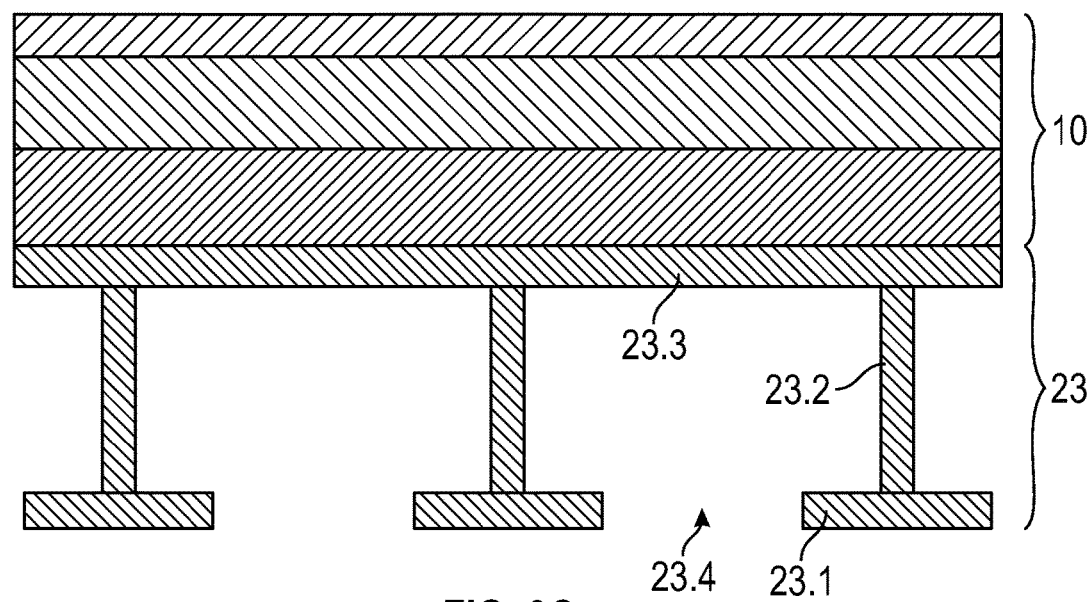

Referring to FIG. 3C, the architected substrate 23 has core members 23.2 with openings 23.4 in only the outermost sandwich panel 23.1, forming a T-shaped architected substrate 23. For example, the innermost sandwich panel 23.3 may extend along the entire imaging sensor 10 and openings 23.4 may only be in the outermost sandwich panel 23.1, but this is merely an example.

In some embodiments, the core (or core member) of the architected substrate 20 may be a microtruss, as provided, for example, in U.S. Pat. Nos. 7,653,279, and 7,382,959, the entire content of each of which is incorporated herein by reference.

The architected substrate 20 may include (or may be formed of) a stiff, ductile material having a modulus that is greater than about 2 GPa and, in some embodiments, is greater than about 70 GPa.

The architected substrate 20 may have a strain to failure of about 0.5% or greater and, in some embodiments, may have a strain to failure of greater than about 5%.

The coefficient of thermal expansion (CTE) of the architected substrate 20 may be between about 0 and about 15 ppm/K and, in some embodiments, may be between about 1 ppm/K and about 8 ppm/K.

The architected substrate 20 may include (or may be formed of) metals and metal alloys, including but not limited to, aluminum, copper, nickel, iron, invar, titanium, molybdenum, steel, tungsten, and/or bismuth. In some embodiments, the architected substrate 20 may include (or may be formed of) a polymer.

In some embodiments, and as another way of forming local stiffness variations, the architected substrate 20 may include a plurality of different materials, and the material composition may vary throughout the architected substrate 20. For example, the material composition of the architected substrate 20 may be a function of in-plane position, out-of-plane position, or both, and the change in material or composition may be discrete or continuous (e.g., the materials may be mixed together and/or partially mixed together at areas of the architected substrate 20).

The thickness, material, and compositional changes described above may or may not follow a pattern.

In some embodiments, the imaging sensor 10 and the architected substrate 20 may be separately formed and then coupled to each other prior to being curved. When the architected substrate 20 has discontinuous portions (e.g., is an island-type architected substrate), it may be considered that a plurality of architected substrates are coupled to the imaging sensor. Similarly, when the architected substrate 20 has material variations in the out-of-plane direction (e.g., the thickness direction), it may be considered that a plurality of architected substrates are coupled to the imaging sensor 10 in the form of layers. For convenience of description, even embodiments including a plurality of architected substrates 20, the overall architected substrate 20 will be referred to in the singular form.

The architected substrate 20 may be coupled to the imaging sensor 10 (e.g., to a bottom surface of the readout integrated circuit 11) by bonding (e.g., a fuse or welding operation), adhering (e.g., using a thermosetting polymer, such as an epoxy or pressure sensitive adhesive), depositing (e.g., electroplating, electroless plating, plasma spray, chemical vapor deposition (CVD), electron-beam CVD, sputter coating, etc.), or attaching (e.g., spin-coating of a polymer followed by UV or thermal cure).

The architected substrate 20 and the imaging sensor 10 may be coupled to each other either when the imaging sensor 10 is at the wafer level (e.g., when a plurality of imaging sensors 10 are joined together on a single wafer) or after singulation of the individual imaging sensors 10.

An interfacial layer may be coupled to the architected substrate 20 before coupling it to the imaging sensor 10 to promote coupling therebetween. In some embodiments, a primer layer and/or a seed layer may also be formed on the architected substrate 20. Further, in some embodiments, an interfacial layer may be coupled to the imaging sensor 10 before coupling it with the architected substrate 20 to promote coupling therebetween. In some embodiments, a primer layer and/or a seed layer may also be formed on the imaging sensor 10 (e.g., on the bottom surface of the readout integrated circuit 11).

In some embodiments, an upper substrate may be coupled to the upper (imaging) surface of the imaging sensor 10 over the antireflective coating 13. The upper substrate may be transparent to the light spectrum of interest to the imaging sensor 10 and may be epitaxially matched to the detector 12 and/or to the substrate of the readout integrated circuit 11. For example, the upper substrate may be formed of (or may include) GaAs and/or GaSb. In some embodiments, the upper substrate may correct for a CTE mismatch between the layers of the imaging sensor 10 and, in such embodiments, may include (or may be formed of) Si.

The device(s) of the imaging sensor and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present disclosure.

It will be understood that, although the terms "first", "second", "third", etc., may be used herein to describe various elements, components, regions, layers, levels, and/or sections, these elements, components, regions, layers, levels, and/or sections should not be limited by these terms. These terms are only used to distinguish one element, component, region, layer, level, or section from another element, component, region, layer, level, or section. Thus, a first element, component, region, layer, level, or section discussed below could be termed a second element, component, region, layer, level, or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the terms "exemplary" and "example" are intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although example embodiments of a curved imaging sensor package with an architected substrate have been described and illustrated herein, many modifications and variations within those embodiments will be apparent to those skilled in the art. Accordingly, it is to be understood that a curved imaging sensor package with an architected substrate according to the present disclosure may be embodied in forms other than as described herein without departing from the spirit and scope of the present disclosure. The present disclosure is defined by the following claims and equivalents thereof.

What is claimed is:

1. An imaging sensor package comprising:
   an imaging sensor comprising a detector, the detector comprising a plurality of light sensing elements; and
   an architected substrate coupled to a bottom surface of the imaging sensor, the architected substrate having openings extending entirely therethrough from a surface contacting the bottom surface of the imaging sensor to an opposite surface thereof to form local stiffness variations along an in-plane direction of the architected substrate,
   wherein the imaging sensor and the architected substrate are curved, and
   wherein the openings in the architected substrate overlap with the light sensing element in a stacking direction from the architected substrate to the imaging sensor.

2. The imaging sensor package of claim 1, wherein the imaging sensor further comprises a readout integrated circuit and an antireflective coating, and
   wherein the detector is arranged between the readout integrated circuit and the antireflective coating.

3. The imaging sensor package of claim 2, wherein the imaging sensor and the architected substrate are spherically curved.

4. The imaging sensor package of claim 3, wherein the architected substrate has thickness variations along the in-plane direction thereof.

5. The imaging sensor package of claim 4, wherein the architected substrate has a plurality of discontinuous portions.

6. An imaging sensor package comprising:
   an imaging sensor; and
   an architected substrate coupled to a bottom surface of the imaging sensor, the architected substrate having local stiffness variations along an in-plane direction of the architected substrate,
   wherein the imaging sensor and the architected substrate are curved, and
   wherein the architected substrate comprises a plurality of sandwich panels with a core between the sandwich panels.

7. The imaging sensor package of claim 6, wherein the core comprises a plurality of core members extending between the sandwich panels.

8. The imaging sensor package of claim 7, wherein the core members are arranged in a prismatic, lattice, or stochastic form.

9. The imaging sensor package of claim 7, wherein an outermost one of the sandwich panels has openings therein.

10. The imaging sensor package of claim 9, wherein an innermost one of the sandwich panels is continuous along the bottom surface of the imaging sensor.

11. A curved imaging sensor package comprising:
    a curved imaging sensor comprising a detector and a readout integrated circuit below the detector, the detector comprising a plurality of light detecting elements spaced from each other; and
    a curved architected substrate coupled to a surface of the readout integrated circuit opposite to the detector, the architected substrate having local stiffness variations along an in-plane direction of the architected substrate,
    wherein the imaging sensor is wrinkled, and
    wherein a wavelength of the wrinkles is less than a pitch of the light detecting elements.

12. The curved image sensor package of claim 11, wherein the wavelength of the wrinkles is less than a size of the light detecting elements.

13. The curved image sensor package of claim 11, wherein an amplitude of the wrinkles is less than twice the pitch of the light detecting elements.

14. The curved image sensor package of claim 11, wherein the architected substrate comprises a plurality of different materials.

15. The curved image sensor package of claim 14, wherein the different materials are stacked on each other in layers.

16. The curved image sensor package of claim 14, wherein the different materials are adjacent to each other in the in-plane direction.

17. The curved image sensor package of claim 14, wherein the materials are mixed together at a portion of the architected substrate.

18. The curved image sensor package of claim 14, wherein the materials comprise aluminum, copper, nickel, iron, invar, steel, titanium, molybdenum, tungsten, and/or bismuth.

19. The curved image sensor package of claim 11, wherein the imaging sensor has a diagonal length of at least 55 mm.

20. A method of manufacturing an imaging sensor package, the method comprising:
    forming an architected substrate to have openings extending entirely therethrough from a surface contacting a bottom surface of an imaging sensor to an opposite surface thereof to form local stiffness variations along an in-plane direction of the architected substrate;
    coupling the architected substrate to the bottom surface of the imaging sensor; and curving the imaging sensor with the architected substrate coupled thereto,
wherein the imaging sensor comprises a detector, the detector comprising a plurality of light sensing elements, and
wherein the openings in the architected substrate overlap with the light sensing element in a stacking direction from the architected substrate to the imaging sensor.

* * * * *